United States Patent
Kim et al.

(10) Patent No.: US 11,532,675 B2
(45) Date of Patent: Dec. 20, 2022

(54) OPTICAL FILTER AND DISPLAY APPARATUS INCLUDING THE SAME

(71) Applicant: Samsung Display Co., Ltd., Yongin-si (KR)

(72) Inventors: Jeongki Kim, Yongin-si (KR);
Kyounghae Min, Yongin-si (KR);
Jeaheon Ahn, Yongin-si (KR);
Seongyeon Lee, Yongin-si (KR); Siwan Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 209 days.

(21) Appl. No.: 17/002,047

(22) Filed: Aug. 25, 2020

(65) Prior Publication Data

US 2021/0151509 A1    May 20, 2021

(30) Foreign Application Priority Data

Nov. 15, 2019  (KR) .......................... 10-2019-0146957

(51) Int. Cl.
*H01L 27/32* (2006.01)
*G02B 5/20* (2006.01)
(Continued)

(52) U.S. Cl.
CPC .......... *H01L 27/322* (2013.01); *G02B 5/0242* (2013.01); *G02B 5/0278* (2013.01);
(Continued)

(58) Field of Classification Search
CPC .............. H01L 27/322; H01L 27/3244; H01L 51/5268; H01L 51/5284; G02B 5/0242; G02B 5/0278; G02B 5/201
See application file for complete search history.

(56) References Cited

U.S. PATENT DOCUMENTS

| 9,753,324 B2 | 9/2017 | Jang et al. |
| 9,921,426 B2 | 3/2018 | Ji et al. |

(Continued)

FOREIGN PATENT DOCUMENTS

| KR | 10-2016-0028858 A | 3/2016 |
| KR | 10-2017-0031613 A | 3/2017 |

(Continued)

*Primary Examiner* — Anne M Hines
(74) *Attorney, Agent, or Firm* — Lewis Roca Rothgerber Christie LLP (57) ABSTRACT

An optical filter including a plurality of color areas and a surrounding area includes a substrate, a first optical layer on the substrate and including a first to third color filter respectively in a first to third color area, a second optical layer including a first color conversion portion, a second color conversion portion and a light transmission portion respectively overlapping the first color filter, the second color filter and the third color filter, and a light blocking layer, where the light blocking layer includes a body portion in the surrounding area including a light blocking material, and the body portion surrounds both a first and a second opening. The first and second color area are adjacent to each other and an area between the first and the second color area correspond to the first opening, and the third color area corresponds to the second opening.

20 Claims, 9 Drawing Sheets

(51) Int. Cl.
*G02B 5/02* (2006.01)
*H01L 51/52* (2006.01)

(52) U.S. Cl.
CPC .......... *G02B 5/201* (2013.01); *H01L 27/3244* (2013.01); *H01L 51/5268* (2013.01); *H01L 51/5284* (2013.01)

(56) References Cited

U.S. PATENT DOCUMENTS

| | | | |
|---|---|---|---|
| 9,989,806 B2 | 6/2018 | Lee et al. | |
| 9,995,958 B2 | 6/2018 | Park et al. | |
| 2018/0138376 A1* | 5/2018 | Koshihara | H01L 27/3241 |
| 2019/0121176 A1 | 4/2019 | Lee et al. | |

FOREIGN PATENT DOCUMENTS

| | | |
|---|---|---|
| KR | 10-1934769 B1 | 1/2019 |
| KR | 10-1973156 B1 | 4/2019 |
| KR | 10-2019-0047592 A | 5/2019 |

* cited by examiner

OPTICAL FILTER AND DISPLAY APPARATUS INCLUDING THE SAME

CROSS-REFERENCE TO RELATED APPLICATION

This application claims priority to and the benefit of Korean Patent Application No. 10-2019-0146957, filed on Nov. 15, 2019, in the Korean Intellectual Property Office, the entire disclosure of which is herein incorporated by reference.

BACKGROUND

1. Field

One or more embodiments of the present disclosure relate to an optical filter and a display apparatus including the same.

2. Description of Related Art

With the development of various electronic apparatuses such as mobile phones, personal digital assistants (PDAs), computers, and large televisions (TVs), various types of display apparatuses applicable thereto have been developed. For example, display apparatuses widely used in the market include liquid crystal display apparatuses, including a backlight unit and organic light emitting display devices emitting light of different colors from respective color areas. Also, display apparatuses including a quantum dot color conversion layer (QD-CCL) have recently been developed. A quantum dot excited by incident light emits light having a longer wavelength than the incident light, and light of a low wavelength band is mainly used as the incident light.

SUMMARY

One or more embodiments include an optical filter having an excellent display quality with a reduced defect rate and improved light emission efficiency, and a display apparatus including the same.

Additional aspects will be set forth in part in the description which follows and, in part, will be apparent from the description, or may be learned by practice of the presented embodiments.

According to one or more embodiments, an optical filter including a plurality of color areas and a surrounding area adjacent to the color areas includes a substrate, a first optical layer on the substrate and including a first color filter, a second color filter, and a third color filter respectively in a first color area, a second color area, and a third color area among the plurality of color areas, a second optical layer including a first color conversion portion overlapping the first color filter, a second color conversion portion overlapping the second color filter, and a light transmission portion overlapping the third color filter, and a light blocking layer, wherein the light blocking layer includes a body portion in the surrounding area and including a light blocking material, and the body portion surrounds both a first opening and a second opening, wherein the first color area and the second color area adjacent to each other and an area between the first color area and the second color area correspond to the first opening, and the third color area corresponds to the second opening.

In an embodiment, an overlapping portion between the first color filter and the second color filter may be at the first opening.

In an embodiment, the third color filter may include a first portion in the third color area, and a second portion in the area between the first color area and the second color area.

In an embodiment, a first surface of the second portion may directly contact at least one of the first color filter and the second color filter.

In an embodiment, the plurality of color areas may further include an adjacent first color area adjacent to the first color area, and the body portion of the light blocking layer may further include a branch portion between the first color area and the adjacent first color area.

In an embodiment, the optical filter may further include at least one of a first capping layer between the first optical layer and the second optical layer and a second capping layer covering the second optical layer.

In an embodiment, the second capping layer may have a lower refractive index than the second optical layer.

In an embodiment, the first color conversion portion, the second color conversion portion, and the light transmission portion may each include scattering particles, the first color conversion portion may further include a first quantum dot and the second color conversion portion may further include a second quantum dot, and the first quantum dot and the second quantum dot may include a same material and have different sizes from each other.

In an embodiment, the first color conversion portion, the second color conversion portion, and the light transmission portion may be spaced apart from each other, the second capping layer and the first capping layer may directly contact each other between the first color conversion portion, the second color conversion portion, and the light transmission portion, and the optical filter may further include a light blocking wall portion between the first color conversion portion, the second color conversion portion, and the light transmission portion.

In an embodiment, the optical filter may further include an overcoating layer covering the second optical layer to provide a flat surface.

According to one or more embodiments, a display apparatus includes a light emitting panel emitting light of a single color, and an optical filter including a plurality of color areas and a surrounding area adjacent to the plurality of color areas and configured to transmit or convert the light emitted from the light emitting panel into light of different colors, wherein the optical filter includes a substrate, a first optical layer on the substrate and including a first color filter, a second color filter, and a third color filter, a second optical layer including a first color conversion portion corresponding to the first color filter, a second color conversion portion corresponding to the second color filter, and a light transmission portion corresponding to the third color filter, and a light blocking layer including a body portion in the surrounding area and including a light blocking material, wherein the first color filter and the second color filter directly contact one surface of a portion of the third color filter between a first color area and a second color area.

In an embodiment, the optical filter may include a plurality of first color areas each including the first color filter and the first color conversion portion overlapping each other, a plurality of second color areas each including the second color filter and the second color conversion portion overlapping each other, and a plurality of third color areas each including the third color filter and the light transmission portion overlapping each other, wherein each of the plurality of third color areas may be entirely surrounded by the body portion.

In an embodiment, the plurality of color areas may further include an adjacent first color area adjacent to the first color area, and the light blocking layer may further include a branch portion connected to the body portion and between the first color area and the adjacent first color area.

In an embodiment, the third color filter may include a first portion in each of the plurality of third color areas, and a second portion between adjacent color areas among the plurality of first color areas, the plurality of second color areas, and the plurality of third color areas.

In an embodiment, the second portion of the third color filter may have a mesh shape on a plane.

In an embodiment, the optical filter may further include at least one of a first capping layer between the first optical layer and the second optical layer and a second capping layer covering the second optical layer.

In an embodiment, the second capping layer may have a lower refractive index than the second optical layer.

In an embodiment, the first color conversion portion, the second color conversion portion, and the light transmission portion may each include scattering particles, the first color conversion portion may further include a first quantum dot and the second color conversion portion may further include a second quantum dot, and the first quantum dot and the second quantum dot may include a same material and have different sizes.

In an embodiment, the display apparatus may further include the first capping layer and the second capping layer, and the first color conversion portion, the second color conversion portion, and the light transmission portion may be spaced apart from each other, the second capping layer and the first capping layer may directly contact each other between the first color conversion portion, the second color conversion portion, and the light transmission portion, and the display apparatus may further include a light blocking wall portion between the first color conversion portion, the second color conversion portion, and the light transmission portion.

In an embodiment, the display apparatus may further include an overcoating layer covering the second optical layer to provide a flat surface thereon.

Other aspects and features in addition to those described above will become apparent from the accompanying drawings, the appended claims, and the detailed description of the disclosure.

BRIEF DESCRIPTION OF THE DRAWINGS

The above and other aspects and features of embodiments of the present disclosure will become more apparent by the following description of example embodiments with reference to the accompanying drawings, in which.

DETAILED DESCRIPTION

Hereinafter, example embodiments will be described in more detail with reference to the accompanying drawings, in which like reference numerals refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Hereinafter, embodiments will be described in detail with reference to the accompanying drawings, and in the following description, like reference numerals will denote like elements and redundant descriptions thereof will be omitted.

It will be understood that although terms such as "first," "second," "third," etc., may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

As used herein, "A and/or B" represents the case of A, B, or A and B. Also, "at least one of A and B" represents the case of A, B, or A and B.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
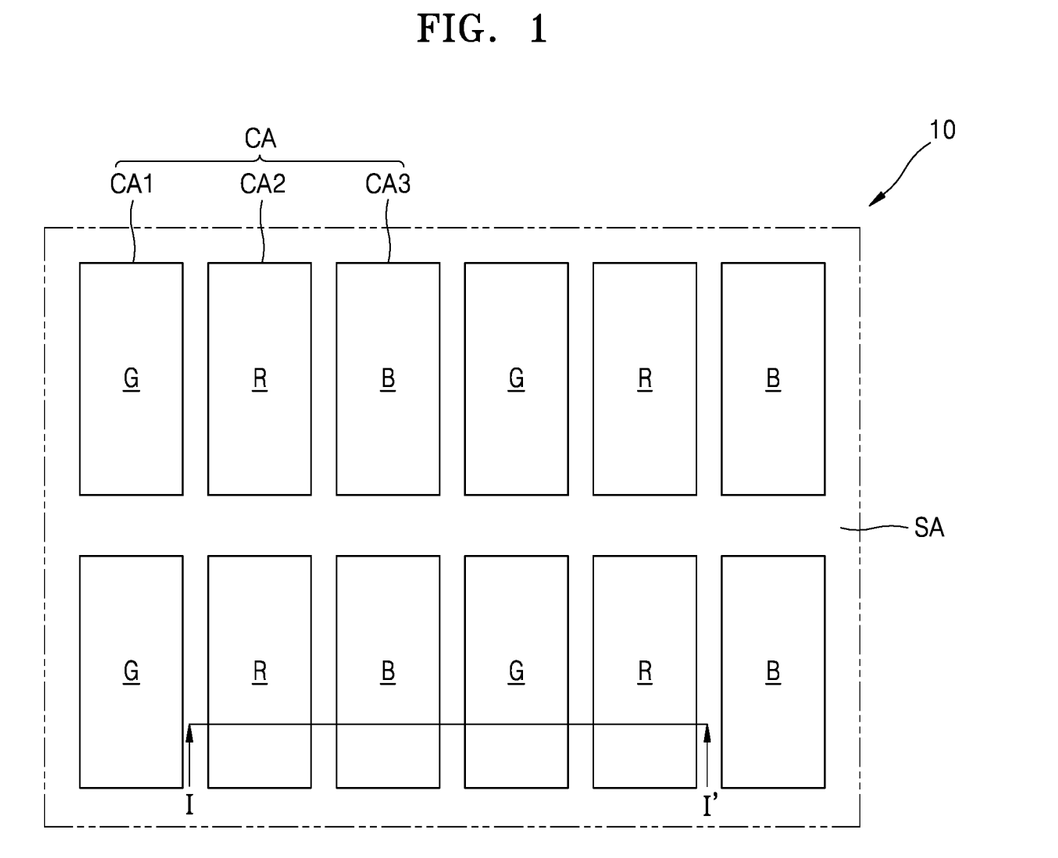
FIG. 1 is a plan view schematically illustrating a portion of a display apparatus according to an embodiment.

FIG. 1 is a plan view schematically illustrating a portion of a display apparatus according to an embodiment.

Referring to FIG. 1, a display apparatus 10 according to an embodiment may include a plurality of color areas CA for emitting light and a surrounding area SA. The surrounding area SA may be adjacent to the color areas CA.

The color area CA may emit light outside the display apparatus and may be divided into a first color area CA1, a second color area CA2, and a third color area CA3 according to the color of emitted light. For example, the first color area CA1 may emit green light G with a peak wavelength of about 495 nm or more and less than about 580 nm, the second color area CA2 may emit red light R with a peak wavelength of about 580 nm or more and less than about 750 nm, and the third color area CA3 may emit blue light B with a peak wavelength of about 400 nm or more and less than about 495 nm.

The first color area CA1, the second color area CA2, and the third color area CA3 may be spaced apart from each other and a surrounding area SA may be therebetween. For example, as illustrated in FIG. 1, the surrounding area SA may have a mesh shape by surrounding the first color area CA1, the second color area CA2, and the third color area CA3.

However, the arrangement of the first color area CA1, the second color area CA2, and the third color area CA3 illustrated in FIG. 1 is merely an example and the first color area CA1, the second color area CA2, and the third color area CA3 may be arranged in various ways with various shapes. Also, the color area CA may further include a fourth color area emitting white light.

Figure 2:
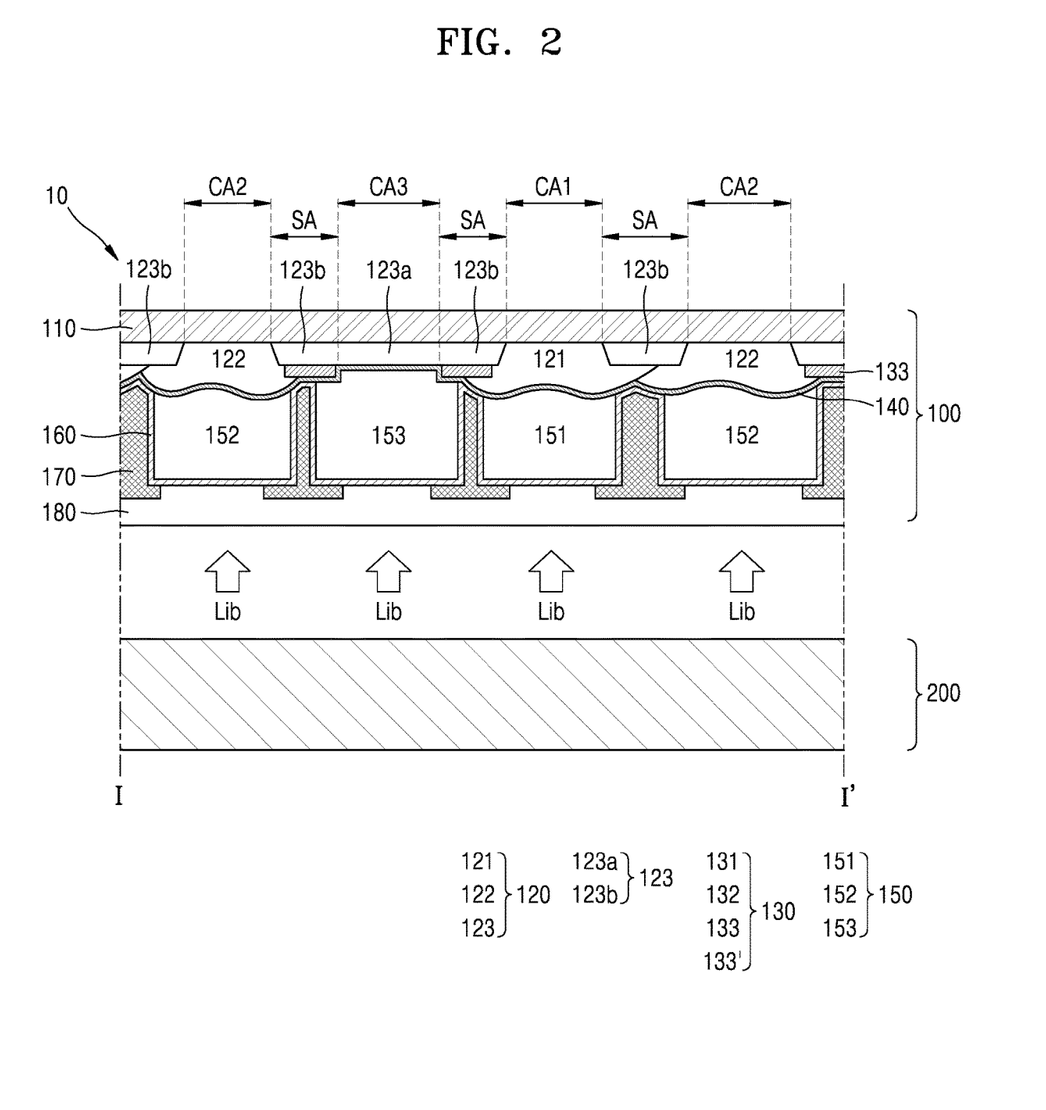
FIG. 2 is a cross-section taken along the line I-I' of FIG. 1 showing a portion of the display apparatus of FIG. 1.

FIG. 2 is a cross-sectional view schematically illustrating an example of a cross-section of FIG. 1 taken along the line I-I' according to an embodiment.

As illustrated in FIG. 2, the display apparatus 10 according to an embodiment may include a light emitting panel 200 and an optical filter 100 stacked on the light emitting panel 200.

The optical filter 100 and the light emitting panel 200 may be directly bonded by a transparent adhesive layer. As another example, a filling layer including a transparent insulating layer or an air layer may be further provided between the optical filter 100 and the light emitting panel 200.

The light generated by the light emitting panel 200 may generate incident light Lib incident on the optical filter 100, and the incident light Lib incident on the optical filter 100 may be converted into light with different colors or may be emitted outside through the color area CA with its color unchanged. For example, the incident light Lib may be blue light, and the light emitted through the color area CA may include red light, blue light, and/or green light.

Figure 3:
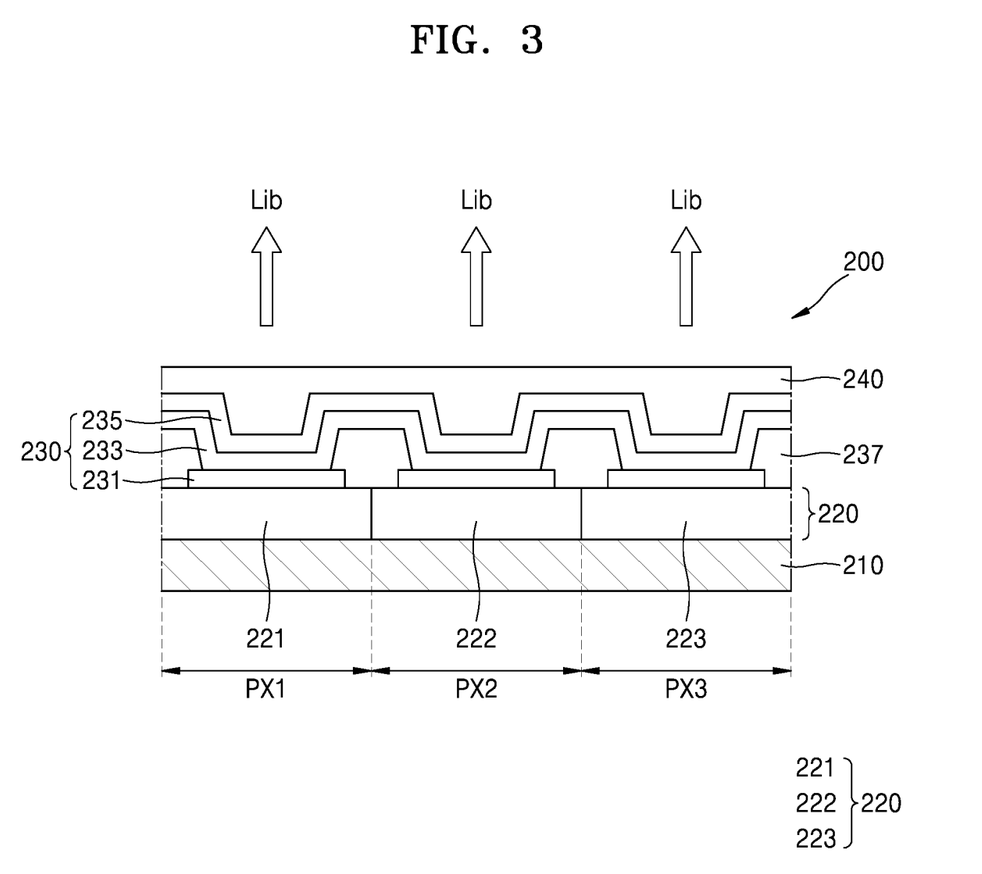
FIG. 3 is a cross-sectional view schematically illustrating an example of a light emitting panel according to an embodiment of the display apparatus of FIG. 1.

FIG. 3 is a cross-sectional view schematically illustrating an example of the light emitting panel 200 according to an embodiment of the display apparatus of FIG. 1.

Referring to FIG. 3, the light emitting panel 200 may include a first substrate 210, a pixel circuit layer 220 arranged on the first substrate 210, a light emitting diode 230, and an encapsulation layer 240.

The first substrate 210 may be transparent and may be formed of, for example, an insulating material such as glass, plastic, or quartz, and the material thereof may be selected considering mechanical strength, thermal stability, transparency, surface smoothness, ease of handling, waterproofness, and/or any other suitable considerations. For example, when the first substrate 210 includes a high molecular weight material, the first substrate 210 may be formed of polycarbonate (PC), polyethylene terephthalate (PET), polyethylene (PE), polypropylene (PP), polysulfone (PSF), polymethylmethacrylate (PMMA), triacetylcellulose (TAC), cycloolefin polymer (COP), cycloolefin copolymer (COC), and/or any other suitable material.

The pixel circuit layer 220 may be on the first substrate 210. The pixel circuit layer 220 may include first to third pixel circuits 221, 222, and 223, respectively, and each of the first to third pixel circuits 221, 222, and 223 may include a plurality of electronic elements, for example, transistors and at least one capacitor.

The light emitting panel 200 may include first to third pixels PX1, PX2, and PX3. The first pixel PX1 may include a light emitting diode 230 and a first pixel circuit 221 for controlling the light emitting diode 230, the second pixel PX2 may include a light emitting diode 230 and a second pixel circuit 222 for controlling the light emitting diode 230, and the third pixel PX3 may include a light emitting diode 230 and a third pixel circuit 223 for controlling the light emitting diode 230.

The first to third pixel circuits 221, 222, and 223 may be electrically connected to the light emitting diodes 230 included in the first to third pixels PX1, PX2, and PX3, respectively. Each light emitting diode 230 may include a first pixel electrode 231, an intermediate layer 233, and an opposite electrode 235 sequentially stacked.

End portions of the first pixel electrodes 231 included in the first to third pixels PX1, PX2, and PX3 may be covered by an insulating layer 237 and spaced apart from each other.

The intermediate layer 233 may include an emission layer. The emission layer may include an organic material. For example, the emission layer may include a low molecular weight organic material or a high molecular weight organic material. The emission layer may include a low molecular weight or high molecular weight organic material capable of emitting blue light. In addition to the emission layer, the intermediate layer 233 may selectively further include at least one functional layer selected from a hole transport layer (HTL), a hole injection layer (HIL), an electron transport layer (ETL), an electron injection layer (EIL), and/or any other suitable layer(s). The intermediate layer 233, for example, the emission layer and the at least one functional layer, may be integrally formed over or on the first substrate 210.

The opposite electrode 235 may include a transparent or semitransparent electrode.

The encapsulation layer 240 may be arranged to cover the light emitting diode 230. The encapsulation layer 240 may include at least one inorganic encapsulation layer and at least one organic encapsulation layer. In an embodiment, the encapsulation layer 240 may include a structure in which a first inorganic encapsulation layer, an organic encapsulation layer, and a second inorganic encapsulation layer are stacked.

The light emitting diodes 230 may generate light with a light amount controlled by a respective one of the first to third pixel circuits 221, 222, and 223, respectively, and emit incident light Lib incident to the optical filter 100 (see FIG. 2). For example, the incident light Lib may be blue light. The light emitting diode 230 may be arranged to correspond to the color area CA (see FIG. 1) of the optical filter 100 (see FIG. 2).

For example, the incident light Lib emitted from the light emitting diode 230 controlled by the first pixel circuit 221 of the first pixel PX1 may be converted into light of a first color through a first color conversion portion 151 (see FIG. 2) and emitted outside through a second substrate 110 (see FIG. 2). The incident light Lib emitted from the light emitting diode 230 controlled by the second pixel circuit 222 of the second pixel PX2 may be converted into light of a second color through a second color conversion portion 152 (see FIG. 2) and emitted outside through the second substrate 110 (see FIG. 2). Also, the incident light Lib emitted from the light emitting diode 230 controlled by the third pixel circuit 223 of the third pixel PX3 may be transmitted through a light transmission portion 153 (see FIG. 2) without color conversion and emitted outside through the second substrate 110 (see FIG. 2). Thus, the incident light Lib emitted from the light emitting panel 200 may be converted into green light, red light, and blue light while passing through the optical filter 100 (see FIG. 2), and thus a color image may be displayed.

Referring back to FIG. 2, the optical filter 100 may include the second substrate 110, a first optical layer 120 on a first surface of the second substrate 110, a second optical layer 150 on the first optical layer 120, and a light blocking layer 130 adjacent to the first optical layer 120. Here, the first surface of the second substrate 110 may face the light emitting panel 200.

The second substrate 110 may be transparent and may be formed of, for example, an insulating material such as glass, plastic, or quartz, and the material thereof may be selected considering mechanical strength, thermal stability, transparency, surface smoothness, ease of handling, waterproofness, and/or any other suitable considerations. For example, when the second substrate 110 includes a high molecular weight material, the second substrate 110 may be formed of polycarbonate (PC), polyethylene terephthalate (PET), polyethylene (PE), polypropylene (PP), polysulfone (PSF), polymethylmethacrylate (PMMA), triacetylcellulose (TAC), cycloolefin polymer (COP), cycloolefin copolymer (COC), and/or suitable materials.

The first optical layer 120 on the first surface of the second substrate 110 may include an organic material pattern including a dye or pigment. The first optical layer 120 may include a first color filter 121 at least in the first color area CA1, a second color filter 122 at least in the second color area CA2, and a third color filter 123 at least in the third color area CA3.

The first color filter 121 may include a pigment or dye of a first color (e.g., green) to selectively transmit only light of the first color, the second color filter 122 may include a pigment or dye of a second color (e.g., red) to selectively transmit only light of the second color, and the third color filter 123 may include a pigment or dye of a third color (e.g., blue) to selectively transmit only light of the third color.

The first to third color filters 121, 122, and 123 may extend to the surrounding area SA between the first to third color areas CA1, CA2, and CA3 to partially overlap adjacent color filters in the surrounding area SA. That is, because the first to third color filters 121, 122, and 123 may be formed larger than the first to third color areas CA1, CA2, and CA3, a defect may not occur in the optical filter 100 even when an error occurs in the position of the formation of the first to third color filters 121, 122, and 123, and thus the manufacturing efficiency of the optical filter 100 may be improved.

The second optical layer 150 may be on the first optical layer 120. The second optical layer 150 may include a first color conversion portion 151, a second color conversion portion 152, and a light transmission portion 153. The first color conversion portion 151 may overlap the first color filter 121, the second color conversion portion 152 may overlap the second color filter 122, and the light transmission portion 153 may overlap the third color filter 123. The first and second color conversion portions 151 and 152 may convert the incident light Lib generated by the light emitting panel 200 into light with a particular color and then emit the light toward the second substrate 110. The light transmission portion 153 may transmit the incident light Lib generated by the light emitting panel 200 without color conversion and then emit the light toward the second substrate 110.

Figure 4:
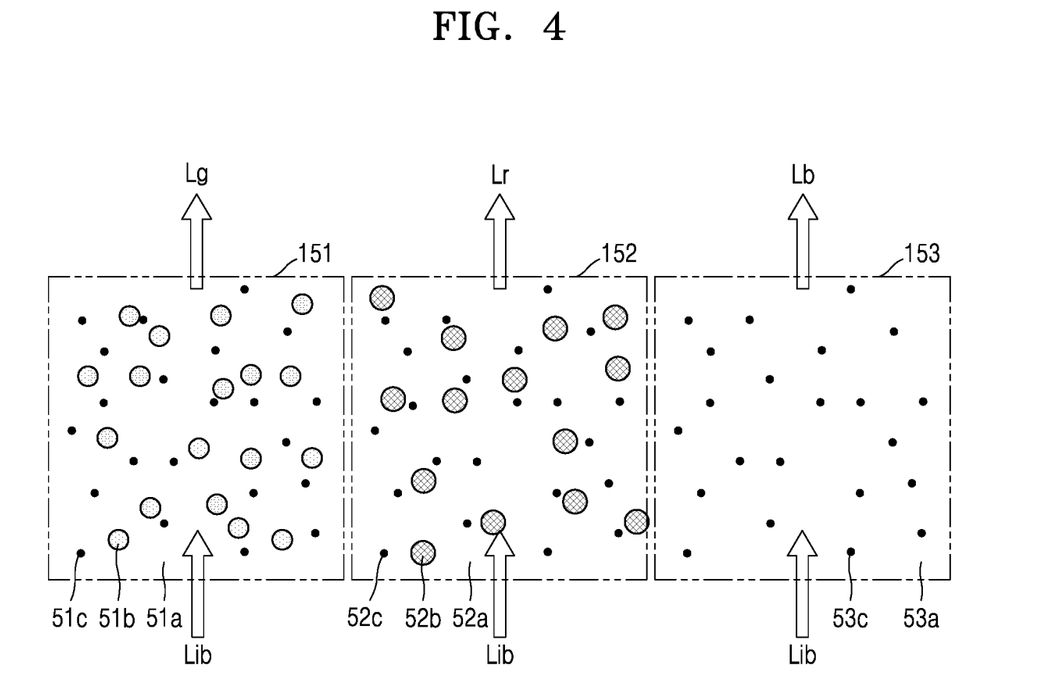
FIG. 4 is a cross-sectional view schematically illustrating an example of a second optical layer according to an embodiment of the display apparatus of FIG. 1.

For example, as illustrated in FIG. 4, the first color conversion portion 151 may convert blue incident light Lib into light Lg of the first color. The light Lg of the first color may be green light. For this purpose, the first color conversion portion 151 may include a first photosensitive polymer 51a in which first quantum dots 51b are dispersed.

The first photosensitive polymer 51a may include an organic material having light transmittance, such as silicone resin or epoxy resin.

The first quantum dots 51b may be excited by the blue incident light Lib to isotropically emit light Lg of the first color having a longer wavelength than blue light. The first quantum dots 51b may include a Group II-VI compound, a Group III-V compound, a Group IV-VI compound, a Group IV compound, or any combination thereof.

First scattering particles 51c may be further dispersed in the first photosensitive polymer 51a. The first scattering particles 51c may scatter the blue incident light Lib, which is not absorbed by the first quantum dots 51b, to excite more first quantum dots 51b, thereby increasing the color conversion efficiency of the first color conversion portion 151. The first scattering particles 51c may include, for example, titanium oxide ($TiO_2$), metal particles, and/or any other suitable particles.

The second color conversion portion 152 may convert the blue incident light Lib into light Lr of the second color. The light Lr of the second color may be red light. The second color conversion portion 152 may include a second photosensitive polymer 52a in which second quantum dots 52b are dispersed, and second scattering particles 52c may be dispersed together with the second quantum dots 52b in the second photosensitive polymer 52a, thereby increasing the color conversion efficiency of the second color conversion portion 152.

The second photosensitive polymer 52a may include the same or substantially the same material as the first photosensitive polymer 51a, and the second scattering particles 52c may include the same or substantially the same material as the first scattering particles 51c. The second quantum dots 52b may include a Group II-VI compound, a Group III-V compound, a Group IV-VI compound, a Group IV compound, or any combination thereof. That is, the second quantum dots 52b may include the same or substantially the same material as the first quantum dots 51b. However, the size of the second quantum dots 52b may be greater than the size of the first quantum dots 51b, and thus the second quantum dots 52b may be excited by the blue incident light Lib to isotropically emit light Lr of the second color having a longer wavelength than blue light and also having a longer wavelength than the light Lg of the first color.

The light transmission portion 153 may include a third photosensitive polymer 53a in which third scattering particles 53c are dispersed. That is, the light transmission portion 153 may not include a separate quantum dot that may be excited by the blue incident light Lib. The third photosensitive polymer 53a may be formed of an organic material having light transmittance like the first photosensitive polymer 51a, and the third scattering particles 53c may include the same or substantially the same material as the first scattering particles 53. Thus, the blue incident light Lib incident on the light transmission portion 153 may pass through the light transmission portion 153 without changing color, and thus light Lb of the third color emitted through the light transmission portion 153 may be blue light. However, the blue incident light Lib may be scattered by the third scattering particles 53c in the light transmission portion 153 and then emitted toward the second substrate 110.

The light blocking layer 130 may be on any one of the first to third color filters 121, 122, and 123. The light blocking layer 130 may include a body portion 133 in the surrounding area SA and including a light blocking material. The light blocking material may include an opaque inorganic insulating material such as chromium oxide or molybdenum oxide or an opaque organic insulating material such as black resin and may block light from being emitted outside through the surrounding area SA to prevent or reduce the occurrence of light leakage in the display apparatus 10.

Any one of the first to third color filters 121, 122, and 123 may be between the second substrate 110 and the body portion 133 of the light blocking layer 130. For example, FIG. 2 illustrates an example in which the light blocking layer 130 is on the third color filter 123 and a portion of the edge of the first color filter 121 and a portion of the edge of the second color filter 122 is on the body portion 133 of the light blocking layer 130.

For this purpose, after the third color filter 123 is located, for example, formed, on the first surface of the second substrate 110 in the remaining area except the positions corresponding to the first color area CA1 and the second color area CA2, the body portion 133 of the light blocking layer 130 may be located, for example, formed, on the third color filter 123 and then the first color filter 121 may be located, for example, formed, in the first color area CA1 and the second color filter 122 may be located, for example, formed, in the second color area CA2. Thus, the surrounding area SA and the first to third color areas CA1, CA2, and CA3 may be partitioned by the third color filter 123 and the light blocking layer 130 including the body portion 133.

Figure 5:
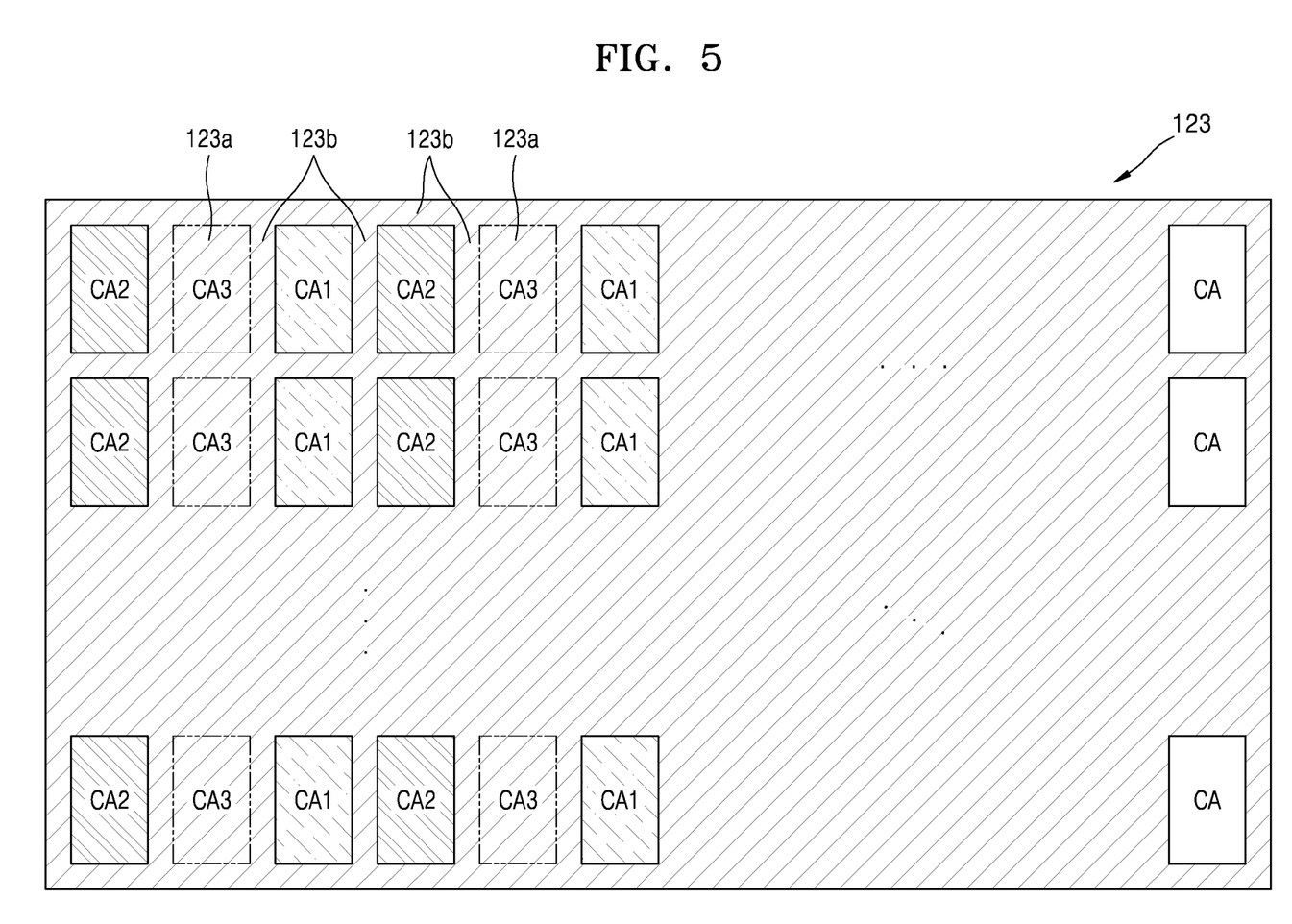
FIG. 5 is a plan view schematically illustrating an example of a third color filter according to an embodiment of the display apparatus of FIG. 1.

FIG. 5 is a plan view schematically illustrating an example of the third color filter 123 according to an embodiment of the display apparatus. The plan view is an orthographic projection looking down at the display apparatus. FIG. 5 also illustrates the position of a plurality of color areas CA, and for convenience, the first color filter 121 in the first color area CA1 and the second color filter 122 in the second color area CA2 are also illustrated in diagonal lines of different forms than the third color filter 123. In FIG. 5, the color area CA represented without diagonal lines may be any one of the first to third color areas CA1, CA2, and CA3. Three dots represented in FIG. 5 may mean that a plurality of color filters are regularly and repeatedly arranged.

The third color filter 123 may include a first portion 123a in each of a plurality of third color areas CA3 and a second portion 123b in the surrounding area SA. That is, the second portion 123b may be between adjacent color areas among a plurality of first color areas CA1, a plurality of second color areas CA2, and the plurality of third color areas CA3. Also, the second portion 123b may be in an area between the first color area CA1 and the second color area CA2. Also, the second portion 123b may have a mesh shape on a plane. However, the mesh shape illustrated in FIG. 5 is merely an example and the second portion 123b may be arranged in various shapes. The first portion 123a and the second portion 123b of the third color filter 123 may be formed of the same or substantially the same material, may be integrally formed, and may be classified according to the formation position thereof.

Figure 6:
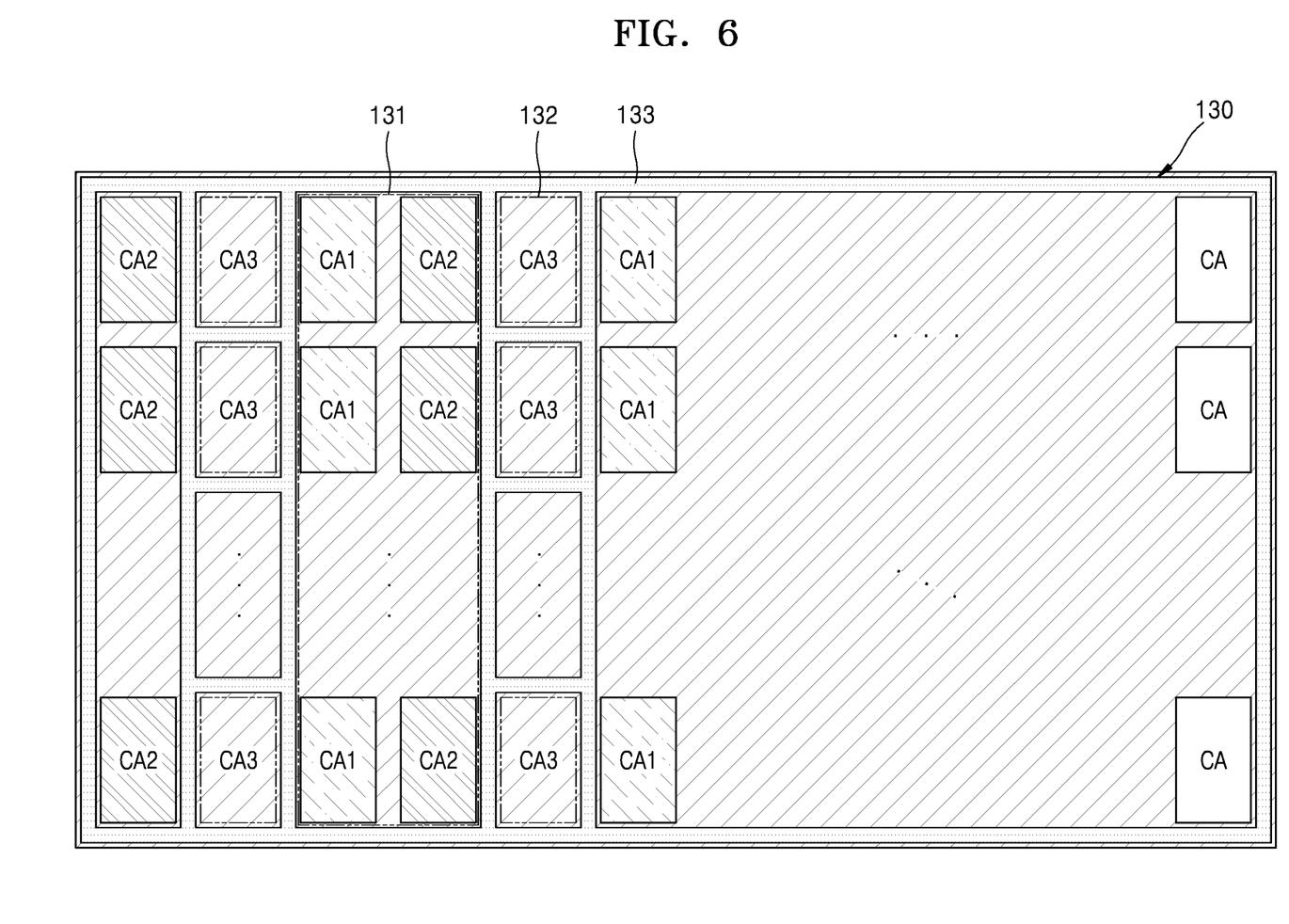
FIG. 6 is a plan view schematically illustrating an example of a light blocking layer formed on the third color filter of FIG. 5.
Figure 7:
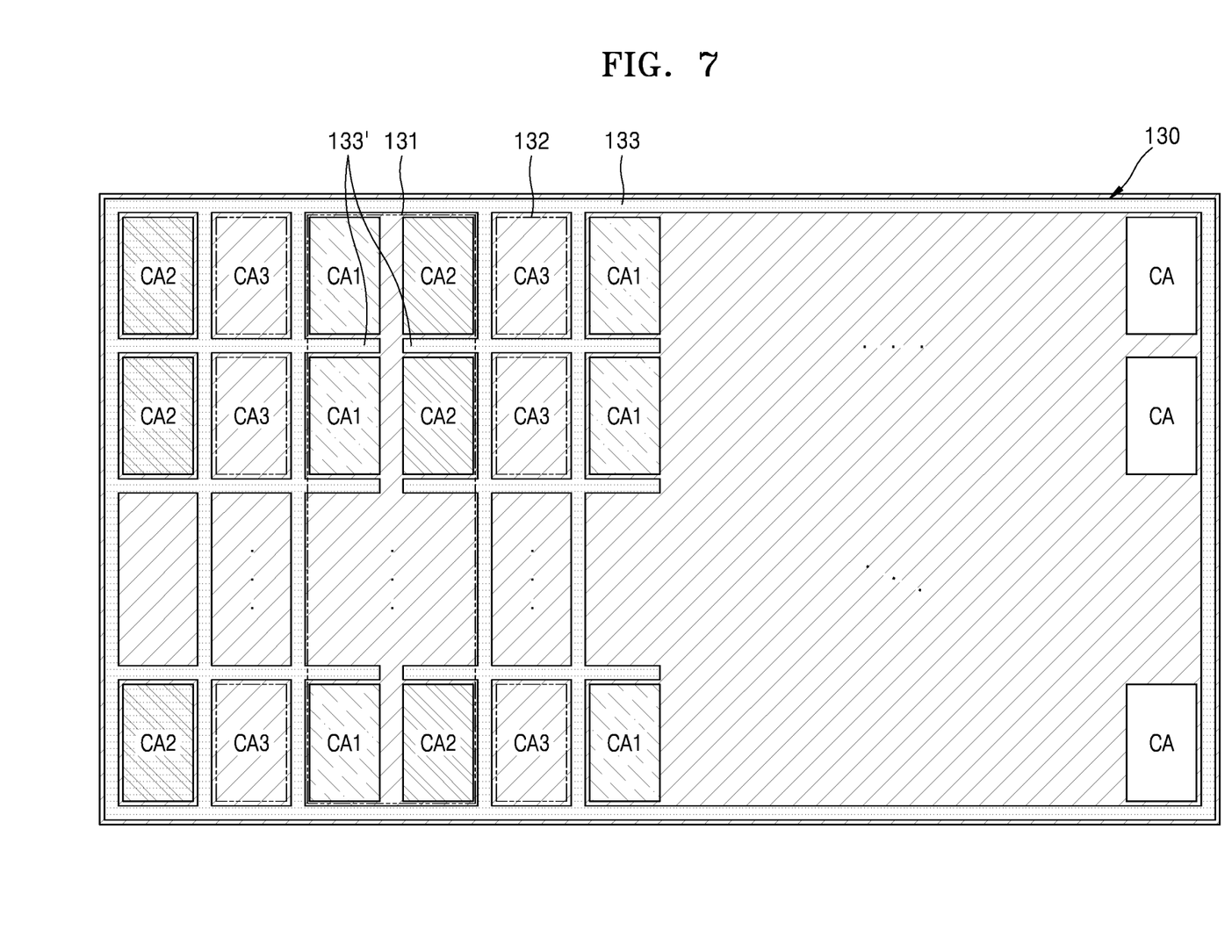
FIG. 7 is a plan view schematically illustrating another example of the light blocking layer formed on the third color filter of FIG. 5 according to an embodiment.

FIGS. 6 and 7 are plan views schematically illustrating examples of the light blocking layer 130 according to embodiments of the display apparatus 10, which are viewed from the light emitting panel 200 toward the second substrate 110. Here, the description of the same points as those in FIG. 5 may be omitted for conciseness.

In the present embodiment, the body portion 133 of the light blocking layer 130 may be located, for example formed, on a first surface of the second portion 123b of the third color filter 123. Here, the first surface of the second portion 123b may face the light emitting panel 200. The body portion 133 of the light blocking layer 130 may not be on the first portion 123a of the third color filter 123 in order not to block the light transmission portion 153. Also, the body portion 133 may be located, for example formed, to have a smaller area than the second portion 123b. Thus, the manufacturing efficiency of the optical filter 100 may be improved because a defect does not occur in the optical filter 100 even when an error occurs in the position of formation of the body portion 133, and also the light conversion efficiency may not be degraded because the body portion 133 of the light blocking layer 130 is arranged not to overlap the first to third color areas CA1, CA2, and CA3.

Referring to FIG. 6, the light blocking layer 130 may include a first opening 131 and a second opening 132 each surrounded by the body portion 133. The first opening 131 and the second opening 132 may be spaced apart from each other. A first color area CA1 and a second color area CA2 adjacent to each other and an area between the first color area CA1 and the second color area CA2 may correspond to the first opening 131 and a third color area CA3 may correspond to the second opening 132. For example, FIG. 6 illustrates a case where a plurality of first color areas CA1 and second color areas CA2 adjacent to each other and an area between the first color area CA1 and the second color area CA2 correspond to the first opening 131 and each of a plurality of third color areas CA3 corresponds to the second opening 132. The arrangement illustrated in FIG. 6 is merely an example and may be modified into various shapes.

The first to third color filters 121, 122, and 123 may partially overlap an adjacent color filter in the surrounding area SA, and an overlap portion between the first color filter 121 and the second color filter 122 may be at the first opening 131. Also, the first surface of the second portion 123b of the third color filter 123 may directly contact at least one of the first color filter 121 and the second color filter 122.

As another example, referring to FIG. 7, a plurality of color areas CA may further include an adjacent first color area CA1 adjacent to the first color area CA1 and a body portion 133 of the light blocking layer 130 may further include a branch portion 133' between the first color area CA1 and the adjacent first color area CA1. The branch portion 133' may be formed of the same or substantially the same material as the body portion 133 and may be integrally formed with the body portion 133. The arrangement illustrated in FIG. 7 is merely an example and may be modified into various shapes.

Because the light blocking layer 13 is formed as described above, the body portion 133 of the light blocking layer 130 may not be between the first color conversion portion 151 and the second color conversion portion 152 and thus the spacing between the first color conversion portion 151 and the second color conversion portion 152 may be secured by the width of the second portion 123b of the third color filter 123. In other words, the spacing between the first color conversion portion 151 and the second color conversion portion 152 may be further increased by reducing an area in which the first color conversion portion 151 and the second color conversion portion 152 overlap the second portion 123b of the third color filter 123.

Figure 8A:
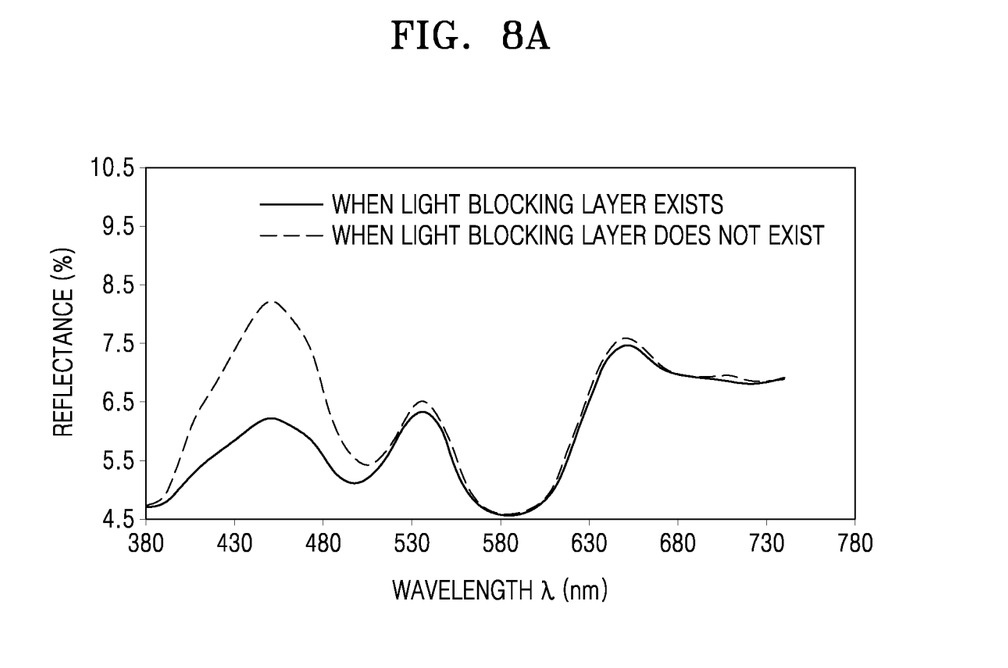
FIGS. 8A to 8C are graphs of wavelength versus reflectance for embodiments of the display apparatus of FIG. 1 in which a light blocking material is provided in the display apparatus and in which the light blocking material is not provided in the display apparatus.
Figure 8B:
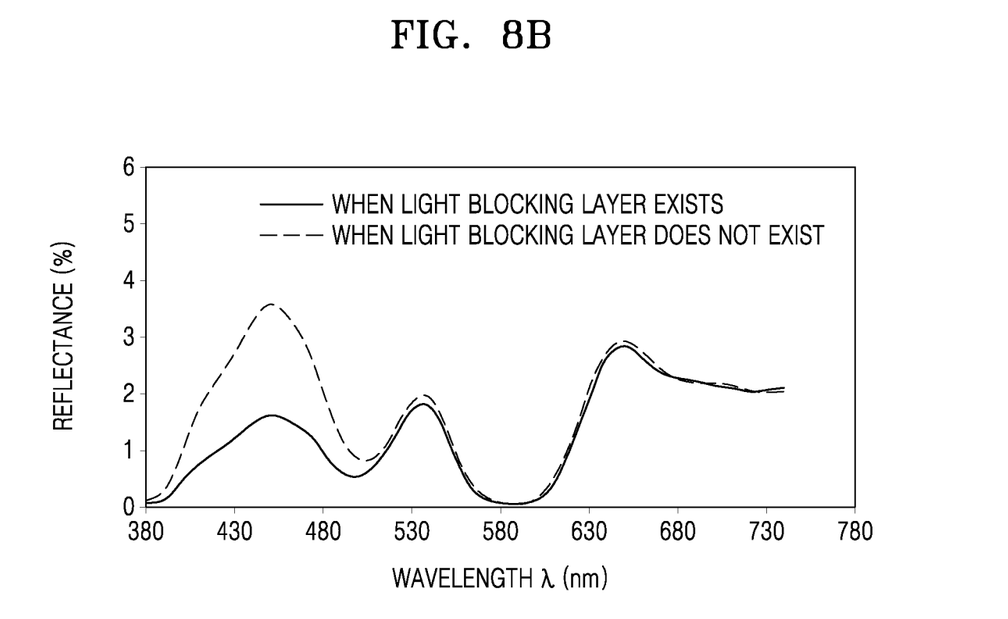
Figure 8C:
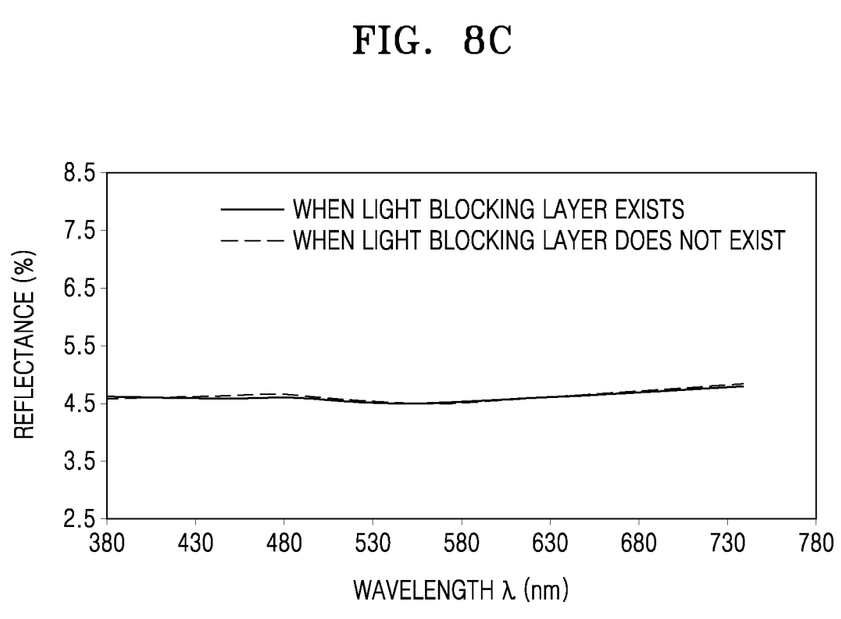

FIGS. 8A to 8C are graphs illustrating the wavelength versus reflectance for embodiments of the display apparatus of FIG. 1 in which a light blocking material is or is not provided (two sentences) in the display apparatus.

In the graphs of FIGS. 8A to 8C, the X axis represents the wavelength of light. In the graph of FIG. 8A, the Y axis represents the specular component included (SCI) reflectance, in the graph of FIG. 8B, the Y axis represents the specular component excluded (SCE) reflectance, and in the graph of FIG. 8C, the Y axis represents the specular light reflectance. In other words, in the graph of FIG. 8A, the Y axis represents the reflectance including both specular light and diffuse light, in the graph of FIG. 8B, the Y axis represents the reflectance of diffuse light excluding specular light, and in the graph of FIG. 8C, the Y axis represents the specular light reflectance excluding the diffuse light reflectance.

Referring to FIGS. 8A and 8B, it may be seen that the reflectance of a wavelength band corresponding to blue light is high when there is no light blocking layer as compared with the case where there is a light blocking layer. When the reflectance of the display apparatus is high, the image may be distorted or deformed due to the reflection of external light and thus the quality of the display apparatus may be degraded. Thus, in order to prevent or reduce the quality degradation of the display apparatus, a light blocking layer may be desirable, and in some embodiments, a light blocking layer around a color area for emitting blue light.

However, because the wavelength bands corresponding to green light and red light have similar reflectances regardless of the existence/nonexistence of a light blocking layer, the light blocking layer around the color area emitting green light and red light may be structurally modified as in the present disclosure.

Unlike the light transmission portion 153, the first color conversion portion 151 and the second color conversion portion 152 may each include a quantum dot; however, because the quantum dot includes nanoparticles, it may be degraded by reacting with moisture, oxygen, and/or the like. Thus, in order to prevent or substantially prevent moisture, oxygen, and/or the like from flowing into the quantum dots, a capping layer may be required around the first color conversion portion 151 and the second color conversion portion 152.

Thus, as shown in FIG. 2, the optical filter 100 may further include a first capping layer 140 between the first optical layer 120 and the second optical layer 150. The first capping layer 140 may include silicon oxide or silicon oxynitride. The first capping layer 140 may have a thickness of about 1000 Å to about 4000 Å.

Also, the optical filter 100 may further include a second capping layer 160 covering the second optical layer 150, that is, the first color conversion portion 151, the second color conversion portion 152, and the light transmission portion 153. The second capping layer 160 may be entirely located, for example, formed, on the first surface of the second substrate 110 to cover the second optical layer 150. The second capping layer 160 may include an inorganic insulating material such as silicon nitride, silicon oxide, or silicon oxynitride and may prevent or reduce the outgassing of the first color conversion portion 151, the second color conversion portion 152, and the light transmission portion 153.

As described above, because the body portion 133 of the light blocking layer 130 is not between the first color conversion portion 151 and the second color conversion portion 152, a sufficient spacing margin may be secured between the first color conversion portion 151 and the second color conversion portion 152. Thus, the design margin of the second capping layer 160 stacked on the second optical layer 150 between the first color conversion portion 151 and the second color conversion portion 152 may also increase to sufficiently cover the periphery of the second optical layer 150. Also, a light blocking wall portion 170 between the first color conversion portion 151 and the second color conversion portion 152 may be well-formed between the first color conversion portion 151 and the second color conversion portion 152. The second capping layer 160 and the well-formed light blocking wall portion 170 may effectively prevent or reduce the occurrence of a light emission efficiency degradation and defects that may be caused by the inflow of moisture, oxygen, and/or the like into the first color conversion portion 151 and the second color conversion portion 152.

Also, by reducing the area in which the first color conversion portion 151 and the second color conversion portion 152 overlap the second portion 123b of the third color filter 123, it may be possible to increase a possibility that the incident light Lib failing to excite the first quantum dots 51b or the second quantum dots 52b will be emitted through the color area CA by being totally reflected at the interface between the first color conversion portion 151 and the second capping layer 160 or at the interface between the second color conversion portion 152 and the second capping layer 160. Accordingly, the utilization of the incident light Lib may be increased and thus the light conversion efficiency of the first and second color conversion portions 151 and 152 may be improved.

The spacing between the first color conversion portion 151 and the second color conversion portion 152 may be adjusted according to the intended light emission efficiency and may also be adjusted according to the intended process margin of the area in which the first and second color conversion portions 151 and 152 overlap the second color filter 123.

Because the first color conversion portion 151, the second color conversion portion 152, and the light transmission portion 153 are spaced apart from each other, the first capping layer 140 and the second capping layer 160 may directly contact between the first color conversion portion 151, the second color conversion portion 152, and the light transmission portion 153. That is, the first color conversion portion 151, the second color conversion portion 152, and the light transmission portion 153 may each be encapsulated by the first capping layer 140 and the second capping layer 160.

The refractive index of the first capping layer 140 and the second capping layer 160 may be lower than the refractive index of the second optical layer 150. For example, the refractive index of the first color conversion portion 151, the second color conversion portion 152, and the light transmission portion 153 may be about 1.5 to about 1.7 and the refractive index of the first capping layer 140 and the second capping layer 160 may be about 1.4 or less.

The first color conversion portion 151, the second color conversion portion 152, and the light transmission portion 153 may be spaced apart from each other by certain distances and the light blocking wall portion 170 may be arranged therebetween. Thus, it may be possible to prevent or substantially prevent the occurrence of color mixing between the lights converted or transmitted by the first color conversion portion 151, the second color conversion portion 152, and the light transmission portion 153 adjacent to each other.

The light blocking wall portion 170 may have various colors including black or white. For example, the light blocking wall portion 170 may be black and may include a black matrix. The light blocking wall portion 170 may include an opaque inorganic insulating material such as chromium oxide or molybdenum oxide or an opaque organic insulating material such as black resin. The light blocking wall portion 170 may include an organic insulating material such as white resin.

Also, the light blocking wall portion 170 may further include metal particles having an excellent reflectance, such as Ag or Al. Thus, the reflectance of the light blocking wall portion 170 may increase reflectance of the incident light Lib that does not excite the first quantum dots 51b or the second quantum dots 52b, thereby reducing the incident light Lib that disappears without exciting the first quantum dots 51b or the second quantum dots 52b. As a result, the utilization of the incident light Lib may increase and thus the light conversion efficiency of the optical filter 100 may be improved.

In addition, the optical filter 100 may further include an overcoating layer 180 covering the second optical layer 150 to provide a flat surface at the surface facing the light emitting panel 200. The overcoating layer 180 may be formed of a transparent organic material such as polyimide resin or acrylic resin. The overcoating layer 180 may be formed, for example, by a wet process such as slit coating or spin coating or by a dry process such as chemical vapor deposition or vacuum deposition.

According to embodiments, an excellent capping layer and light blocking wall portion may be obtained by sufficiently securing the spacing between the adjacent color conversion portions of the optical filter, thus making it possible to prevent or reduce the occurrence of the light emission efficiency degradation and defects that may occur in the color conversion portions of the optical filter. Also, the utilization of the incident light may be increased by reducing the area in which the color conversion portions overlap a portion of one color filter, thus making it possible to provide an optical filter with improved light conversion efficiency and a display apparatus including the same. In addition, it may be possible to reduce the material of the light blocking material and improve the manufacturing process efficiency thereof. However, the scope of the present disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their respective equivalents.

What is claimed is:

1. An optical filter comprising a plurality of color areas and a surrounding area adjacent to the color areas, the optical filter comprising:
    a substrate;
    a first optical layer on the substrate and comprising a first color filter, a second color filter, and a third color filter respectively in a first color area, a second color area, and a third color area among the plurality of color areas;
    a second optical layer comprising a first color conversion portion overlapping the first color filter, a second color conversion portion overlapping the second color filter, and a light transmission portion overlapping the third color filter; and
    a light blocking layer,
    wherein the light blocking layer comprises a body portion in the surrounding area comprising a light blocking material; and the body portion surrounds both a first opening and a second opening,
    wherein the first color area and the second color area are adjacent to each other and an area between the first color area and the second color area corresponds to the first opening, and
    the third color area corresponds to the second opening.

2. The optical filter of claim 1, wherein an overlapping portion between the first color filter and the second color filter is at the first opening.

3. The optical filter of claim 1, wherein the third color filter comprises:
    a first portion in the third color area; and
    a second portion in the area between the first color area and the second color area.

4. The optical filter of claim 3, wherein a first surface of the second portion directly contacts at least one of the first color filter or the second color filter.

5. The optical filter of claim 1, wherein the plurality of color areas further comprises an adjacent first color area adjacent to the first color area, and
    the body portion of the light blocking layer further comprises a branch portion between the first color area and the adjacent first color area.

6. The optical filter of claim 1, further comprising at least one of a first capping layer between the first optical layer and the second optical layer and a second capping layer covering the second optical layer.

7. The optical filter of claim 6, wherein the second capping layer has a lower refractive index than the second optical layer.

8. The optical filter of claim 1, wherein the first color conversion portion, the second color conversion portion, and the light transmission portion each comprise scattering particles,
    wherein the first color conversion portion further comprises a first quantum dot and the second color conversion portion further comprises a second quantum dot, and
    wherein the first quantum dot and the second quantum dot comprise a same material and have different sizes from each other.

9. The optical filter of claim 6, wherein the first color conversion portion, the second color conversion portion, and the light transmission portion are spaced apart from each other,
    the second capping layer and the first capping layer directly contact each other between the first color conversion portion, the second color conversion portion, and the light transmission portion, and
    the optical filter further comprises a light blocking wall portion between the first color conversion portion, the second color conversion portion, and the light transmission portion.

10. The optical filter of claim 8, further comprising an overcoating layer covering the second optical layer to provide a flat surface thereon.

11. A display apparatus comprising:
    a light emitting panel to emit light of a single color; and
    an optical filter comprising a plurality of color areas and a surrounding area adjacent to the plurality of color areas, and configured to transmit or convert the light emitted from the light emitting panel into light of different colors,
    wherein the optical filter further comprises:
    a substrate;
    a first optical layer on the substrate and comprising a first color filter, a second color filter, and a third color filter;
    a second optical layer comprising a first color conversion portion corresponding to the first color filter, a second color conversion portion corresponding to the second color filter, and a light transmission portion corresponding to the third color filter; and
    a light blocking layer comprising a body portion in the surrounding area and comprising a light blocking material,
    wherein the first color filter and the second color filter directly contact one surface of a portion of the third color filter between a first color area and a second color area.

12. The display apparatus of claim 11, wherein the optical filter further comprises:
    a plurality of first color areas each comprising the first color filter and the first color conversion portion overlapping each other;
    a plurality of second color areas each comprising the second color filter and the second color conversion portion overlapping each other; and
    a plurality of third color areas each comprising the third color filter and the light transmission portion overlapping each other,
    wherein each of the plurality of third color areas is entirely surrounded by the body portion.

13. The display apparatus of claim 12, wherein the plurality of color areas further comprises an adjacent first color area adjacent to the first color area, and the light blocking layer further comprises a branch portion connected to the body portion between the first color area and the adjacent first color area.

14. The display apparatus of claim 12, wherein the third color filter comprises:
   a first portion in each of the plurality of third color areas; and
   a second portion between adjacent color areas among the plurality of first color areas, the plurality of second color areas, and the plurality of third color areas.

15. The display apparatus of claim 14, wherein the second portion of the third color filter has a mesh shape on a plane.

16. The display apparatus of claim 11, further comprising at least one of a first capping layer between the first optical layer and the second optical layer and a second capping layer covering the second optical layer.

17. The display apparatus of claim 16, wherein the second capping layer has a lower refractive index than the second optical layer.

18. The display apparatus of claim 11, wherein the first color conversion portion, the second color conversion portion, and the light transmission portion each comprise scattering particles,
   the first color conversion portion further comprises a first quantum dot and the second color conversion portion further comprises a second quantum dot, and
   the first quantum dot and the second quantum dot comprise a same material and have different sizes from each other.

19. The display apparatus of claim 16, further comprising both the first capping layer and the second capping layer,
   wherein the first color conversion portion, the second color conversion portion, and the light transmission portion are spaced apart from each other,
   the second capping layer and the first capping layer directly contact each other between the first color conversion portion, the second color conversion portion, and the light transmission portion, and
   the display apparatus further comprises a light blocking wall portion between the first color conversion portion, the second color conversion portion, and the light transmission portion.

20. The display apparatus of claim 18, further comprising an overcoating layer covering the second optical layer to provide a flat surface thereon.

* * * * *